US008314475B2

(12) United States Patent
Ribeiro et al.

(10) Patent No.: US 8,314,475 B2
(45) Date of Patent: Nov. 20, 2012

(54) NANOSCALE ELECTRONIC DEVICE WITH ANISOTROPIC DIELECTRIC MATERIAL

(75) Inventors: Gilberto Medeiros Ribeiro, Mountain View, CA (US); Philip J. Kuekes, Menlo Park, CA (US); Alexandre M. Bratkovski, Mountain View, CA (US); Janice H. Nickel, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 235 days.

(21) Appl. No.: 12/942,131

(22) Filed: Nov. 9, 2010

(65) Prior Publication Data

US 2012/0112167 A1    May 10, 2012

(51) Int. Cl.
*H01L 29/93* (2006.01)
(52) U.S. Cl. .................. 257/595; 257/30; 257/E49.003
(58) Field of Classification Search ................... 257/595
See application file for complete search history.

(56) References Cited

U.S. PATENT DOCUMENTS

| 7,026,676 | B2 | 4/2006 | Ahner et al. |
| 7,186,607 | B2 | 3/2007 | Seidl et al. |
| 7,656,696 | B2 | 2/2010 | Joo et al. |
| 2004/0026714 | A1 | 2/2004 | Krieger et al. |
| 2007/0229111 | A1 | 10/2007 | Mouttet |
| 2009/0027944 | A1 | 1/2009 | Ufert |

FOREIGN PATENT DOCUMENTS

JP    2007273618 A    10/2007

*Primary Examiner* — Marcos D. Pizarro
*Assistant Examiner* — Eva Yan Montalvo

(57) ABSTRACT

One example of the present invention is a nanoscale electronic device comprising a first conductive electrode, a second conductive electrode, and an anisotropic dielectric material layered between the first and second electrodes having a permittivity in a direction approximately that of the shortest distance between the first and second electrodes less than the permittivity in other directions within the anisotropic dielectric material. Additional examples of the present invention include integrated circuits that contain multiple nanoscale electronic devices that each includes an anisotropic dielectric material layered between first and second electrodes having a permittivity in a direction approximately that of the shortest distance between the first and second electrodes less than the permittivity in other directions within the anisotropic dielectric material.

20 Claims, 13 Drawing Sheets

NANOSCALE ELECTRONIC DEVICE WITH ANISOTROPIC DIELECTRIC MATERIAL

TECHNICAL FIELD

The present invention is related to nanoscale electronics and, in particular, to a nanoscale switch that can be rapidly switched between two or more electronic states and that can be switched by applying relatively low voltages.

BACKGROUND

The dimensions of electronic circuit elements have decreased rapidly over the past half century. Familiar circuit elements, including resistors, capacitors, inductors, diodes, and transistors that were once macroscale devices soldered by hand into macroscale circuits are now fabricated at sub-microscale dimensions within integrated circuits. Photolithography-based semiconductor manufacturing techniques can produce integrated circuits with tens of millions of circuit elements per square centimeter. The steady decrease in size of circuit elements and increase in the component densities of integrated circuits have enabled a rapid increase in clock speeds as which integrated circuits can be operated as well as enormous increases in the functionalities, computational bandwidths, data-storage capacities, and efficiency of operation of integrated circuits and integrated-circuit-based electronic devices.

Unfortunately, physical constraints with respect to further increases in the densities of components within integrated-circuits manufactured using photolithography methods are being approached. Ultimately, photolithography methods are constrained by the wave length of radiation passing through photolithography masks in order to fix and etch photoresist and, as dimensions of circuit lines and components decrease further into nanoscale dimensions, current leakage through tunneling and power-losses due to relatively high resistances of nanoscale components are providing challenges with respect to further decreasing component sizes and increasing component densities by traditional integrated-circuit-manufacturing and design methodologies. These challenges have spawned entirely new approaches to the design and manufacture of nanoscale circuitry and circuit elements. Research and development efforts are currently being expended to create extremely dense, nanoscale electronic circuitry through self-assembly of nanoscale components, nanoscale imprinting, and other relatively new methods. In addition, new types of circuit elements that operate at nanoscale dimensions have been discovered, including memristive switching materials that can be employed as bistable nanoscale memory elements. Initially, memristor implementations were constrained by relatively low switching frequencies, but newer techniques for manufacturing memristive memory, elements and other memristor-based devices have produced memristive devices that can be switched at gigahertz frequencies. Efforts continue to improve both switching times and power efficiency of memristive memory elements and other nanoscale electronic devices that incorporate dielectric materials with multiple, stable electronic states.

DETAILED DESCRIPTION OF THE INVENTION

The present invention is directed to nanoscale electronic devices that can be rapidly switched by applying relatively low voltages across the nanoscale electronic devices. Switching times of nanoscale electronic devices are directly related to the frequencies at which integrated circuits that incorporate nanoscale electronic devices can be operated, in turn directly related to the computational bandwidths and data-access and data-transfer bandwidths that can be achieved by integrated circuits that incorporate nanoscale electronic devices. Low-power operation results in a decrease in waste heat generated during operation of the integrated circuits, a decrease in energy consumption of integrated circuits during operation, and increases in the reliabilities of integrated circuits as a result of decreasing unwanted tunneling and undesirable current paths within nanoscale circuitry.

The term "nanoscale" refers to components or features with at least one dimension less than about 50 nm. Many nanoscale components have dimensions of less than 30 nm, and nanoscale components produced by newest techniques may have dimensions of 10 nm or less. In the following discussion, materials used in certain types of nanoscale devices are referred to as "dielectric materials." These materials may be insulators, semiconductors, or may have properties that vary depending on applied voltage, on a history of current directed through the materials, and other parameters.

Figure 1A:
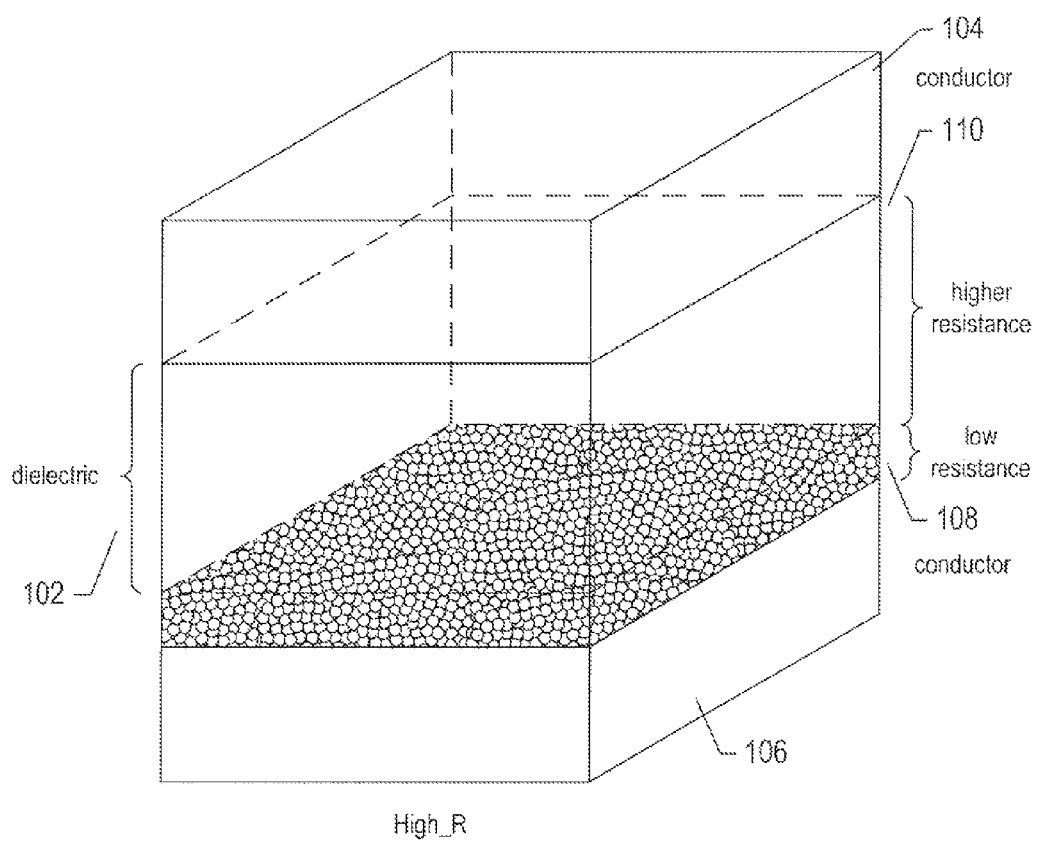
FIGS. 1A-B illustrate an example nanoscale electronic device that features two stable electronic states.
Figure 1B:
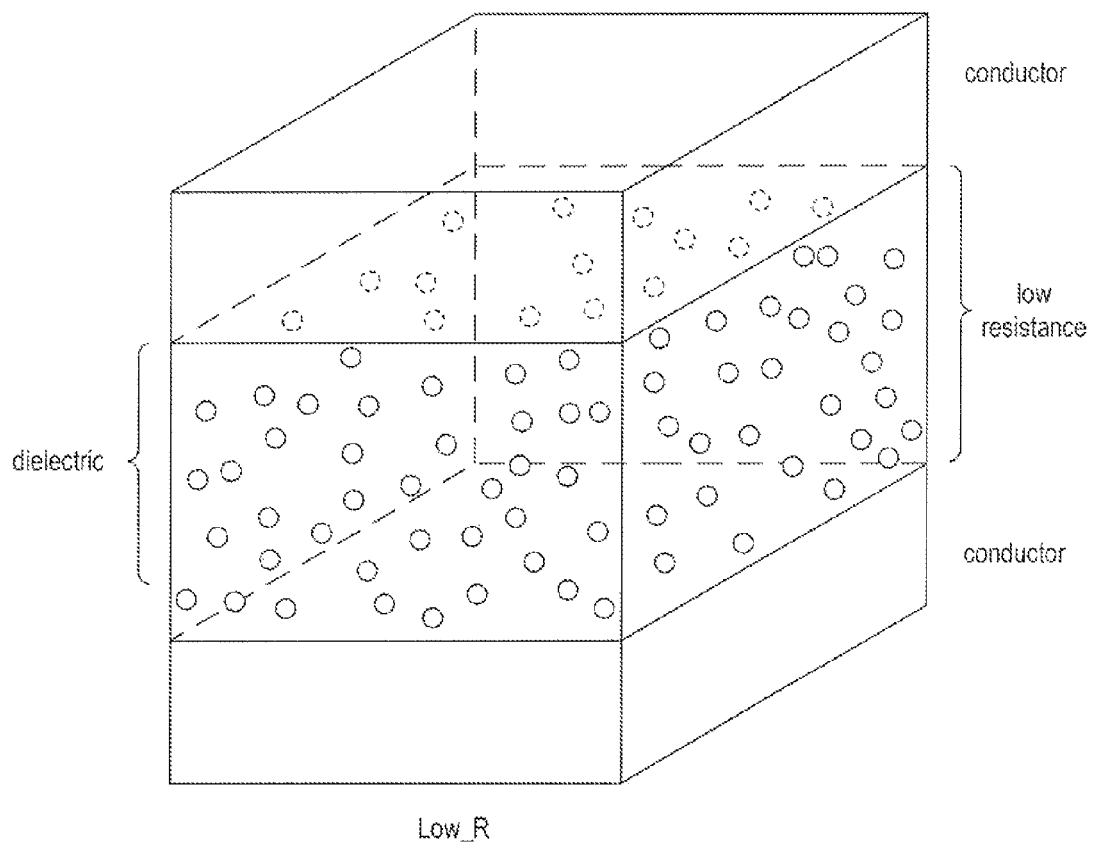

FIGS. 1A-B illustrate an example nanoscale electronic device that features two stable electronic states. FIG. 1A shows the device in a relatively high-resistance state and FIG. 1B shows the device in a relatively low-resistance state. The resistivity of a dielectric material between electrodes can be electronically sensed, and thus the two different resistance states shown in FIGS. 1A-B can be used to store a single bit of information.

FIGS. 1A-B both use the same illustration conventions. In FIG. 1A, a dielectric material 102 is sandwiched between two conductive electrodes 104 and 106. Those portions of the electrodes overlying and underlying the bistable dielectric material 102 are shown in FIG. 1A. In general, the electrodes may be nanowires or other conductive elements that electrically interconnect the nanoscale electronic device with other nanoscale electronic devices, nanoscale circuitry, and, ultimately, microscale and macroscale circuitry. In FIG. 1, the dielectric material 102 is shown to have two different portions: (1) a low-resistivity portion 108 and a higher-resistivity portion 110. The low-resistivity portion is a depletion region that includes, as one example, oxygen vacancies that facilitate current conduction. The higher-resistivity portion 110 of the dielectric material lacks the vacancies, and thus has the conductance of an undoped semiconductor or dielectric substance. When a sufficiently large-magnitude voltage is applied across the dielectric material in an upward vertical direction, or z direction, in FIGS. 1A-B, the oxygen vacancies can be redistributed within the dielectric material between the two electrodes as shown in FIG. 1B. Redistribution of the oxygen vacancies results in the dielectric material having a relatively low resistance throughout. Applying a sufficiently large voltage in the opposite direction, or negative voltage in the upward, vertical direction in FIG. 1B, results in forcing the vacancies to distribute themselves nearer to the lower electrode, as in FIG. 1A.

Figure 2:
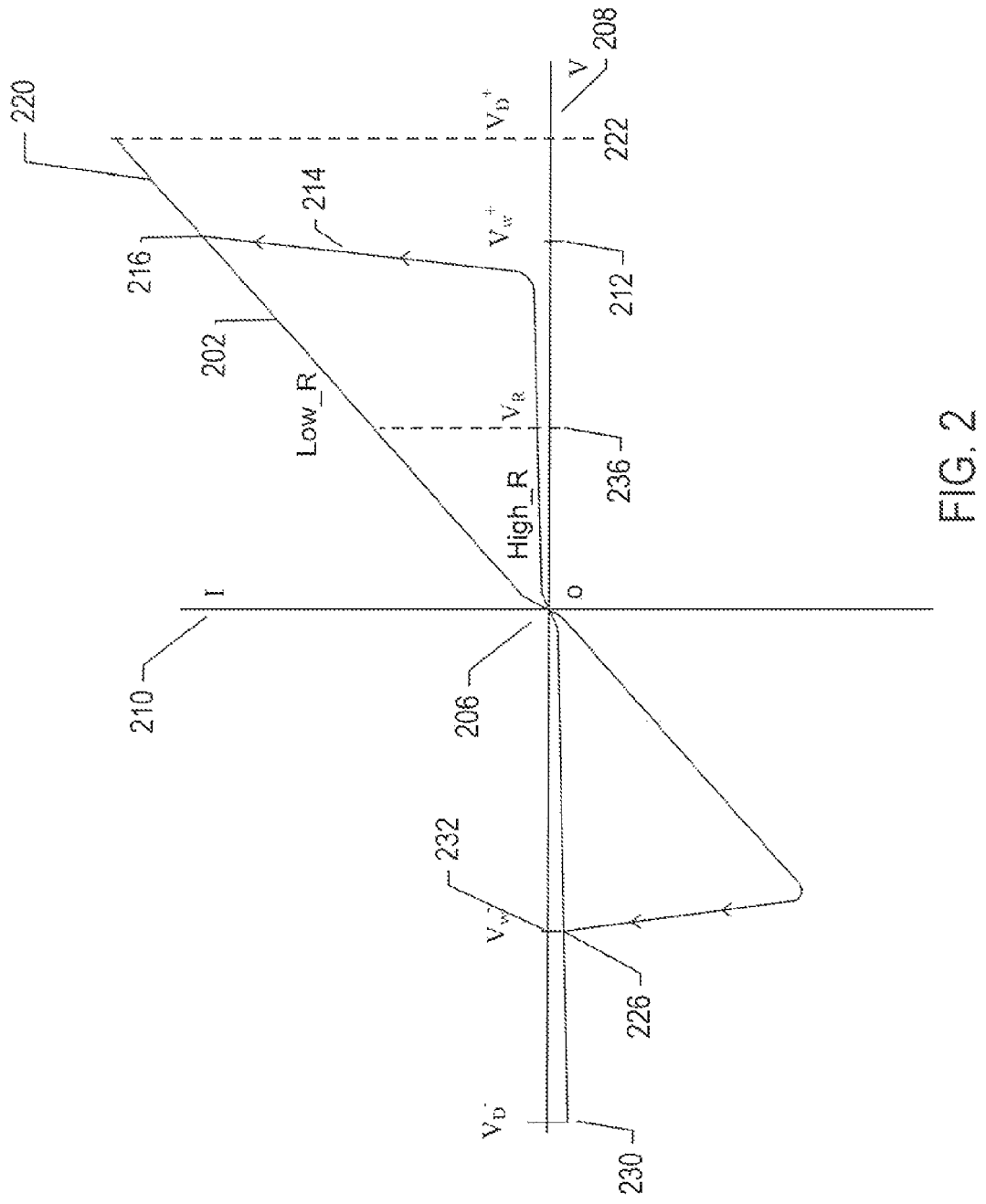
FIG. 2 shows current versus voltage behavior of the bistable nanoscale electronic device illustrated in FIGS. 1A-B.

FIG. 2 shows current versus voltage behavior of the bistable nanoscale electronic device illustrated in FIGS. 1A-B. The portion of the I-V curve with relatively large slope 202 is the portion of the I-V curve corresponding to the low-resistance state of the nanoscale electronic device, illustrated in FIG. 1B. The slope of this curve is proportional to the conductivity and inversely proportional to the resistivity of the dielectric material between the two electrodes. The portion of the I-V curve with a small-magnitude slope 204 corresponds to the high-resistance state of the nanoscale electronic device shown in FIG. 1A. Beginning at the origin 206 of the voltage 208 and current 210 axes, and assuming that the nanoscale electronic device is in the high-resistance state shown in FIG. 1A, application of increasing positive voltage from the lower electrode to the upper electrode results in a very small increase in current across the dielectric material, as represented by the right-hand portion of the I-V curve 204, until the applied positive voltage nears the voltage $V_W^+$ 212, at which point the oxygen vacancies are rapidly redistributed throughout the dielectric or semi-conductive material, as a result of which the current rapidly increases, as represented by the nearly vertical portion of the I-V curve 214, until the portion of the I-V curve representing the low-resistance state is reached at point 216. Further increase in the positive voltage results in a relatively large, corresponding increase in current, along the far right portion of the low-resistance-state I-V curve 220 until a voltage $V_D^+$ 222 is reached, at which point the device fails due to generation of excessive amounts of heat as a result of resistive heating by the high current passing through the device. Once the low-resistance state is reached, at point 216, then as the voltage applied across the electrodes is decreased, the low-resistance-state I-V curve 202 is followed leftward, descending back to the origin 206, and, as voltage is further decreased to negative voltages of increasing magnitude, the current switches in direction and increases in magnitude to point 224, at which point oxygen vacancies are again redistributed back to a dense layer near the lower electrode, as shown in FIG. 1A, leading to a rapid decrease in the magnitude of the current flowing through the device and a return to the high-resistance state at point 226. Further increase in the magnitude of the negative voltage applied across the device eventually leads to the voltage $V_D^-$ 230, at which point the device again fails due to resistive heating.

The voltage at which the nanoscale electronic device transitions from the low-resistance state to the high-resistance state is referred to as $V_W^-$ 232. Choosing the high-resistance state to represent Boolean value "0" and the low-resistance state to represent Boolean value "1," application of the positive voltage $V_W^+$ can be considered to be a WRITE-1 operation and application of the negative voltage $V_W^-$ can be considered to be a WRITE-0 operation. Application of an intermediate-magnitude voltage $V_R$ 236 can be used to interrogate the value currently stored in the nanoscale electronic device. When the voltage $V_R$ is applied to the device, and when, as a result, a relatively large magnitude current flows through the device, the device is in the low-resistance, or Boolean 1 state, but when relatively little current passes through the device, the device is in the Boolean 0 state. Thus, the nanoscale electronic device illustrated in FIGS. 1A-B and FIG. 2 can serve as a nanoscale memory element, and two-dimensional or three-dimensional arrays of such devices can be employed as two-dimensional and three-dimensional memory arrays.

Although this example, and a subsequent example, feature bistable materials that can have either of two different stable electronic states, depending on the history of voltages applied across the device, devices with three or more stable states can also be used in various applications. For example, a device with three stable states can store one of three different values "0," "1," or "2," of a base-3 number system, or two of the three stable states of the three-state device can be used for storing a bit value, with the non-assigned state providing further separation from the information-storing states.

Figure 3A:
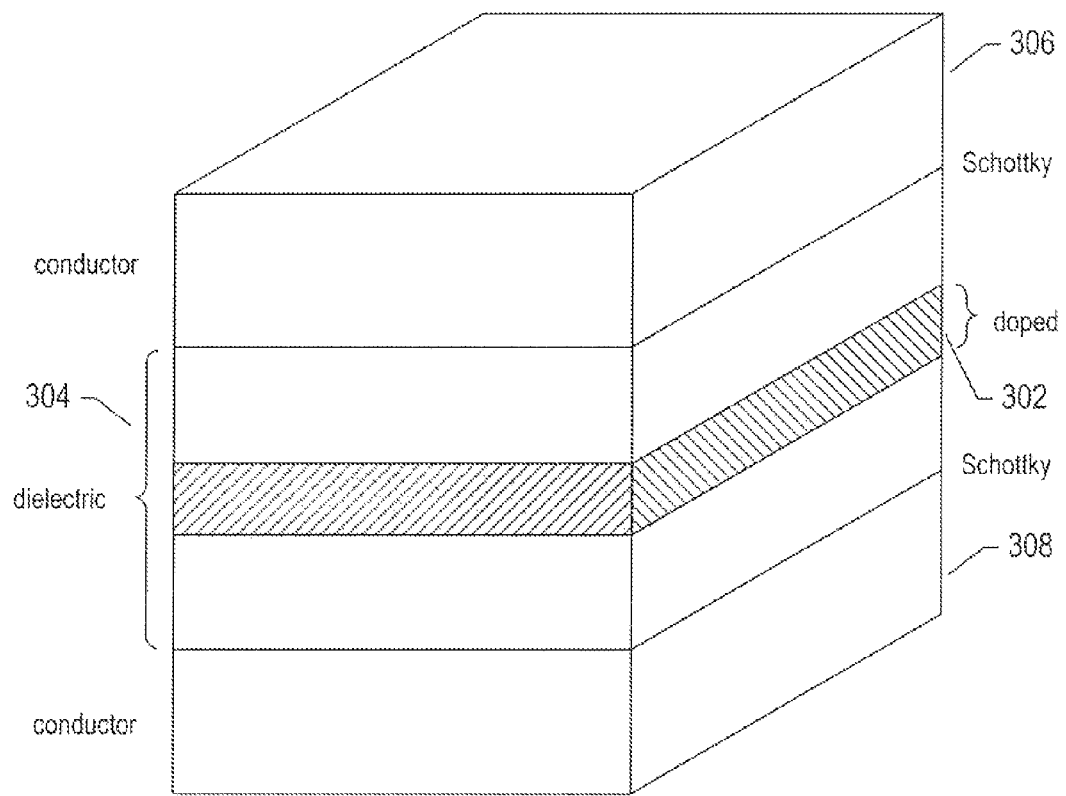
FIGS. 3A-B illustrate a second example of a nanoscale electronic device that features two stable electronic states.
Figure 3B:
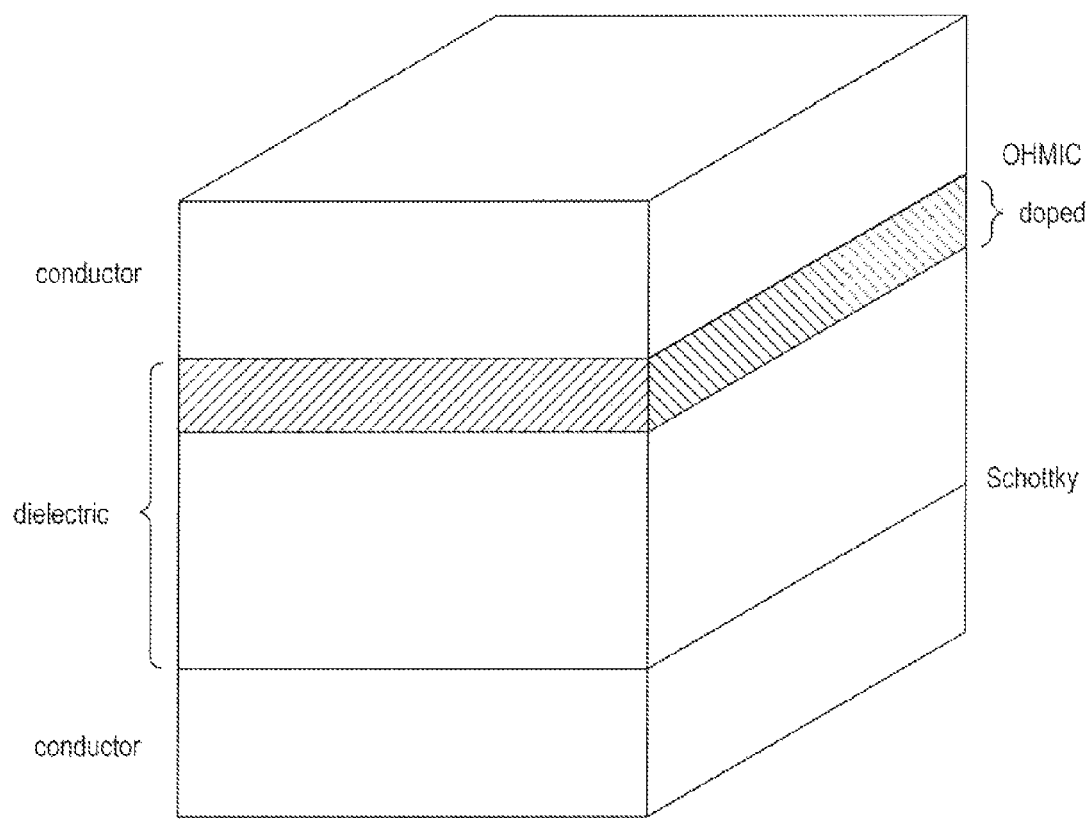

FIGS. 3A-B illustrate a second example of a nanoscale electronic device that features two stable electronic states. FIG. 3A shows a high-resistance state of the device, in which mobile dopants are concentrated in a doped layer 302 near the middle of the dielectric layer 304. The regions of the dielectric layer adjacent to the two conductive electrodes 306 and 308 are undoped, and the interface between the semiconductor layer and conductive electrodes form Schottky barriers or junctions with relatively large energy thresholds for injection of carriers into the semi-conductive layer. Application of a sufficient voltage across the electrodes can move the dopant layer, as shown in FIG. 3B, to a position adjacent to one of the electrodes. The interface between the doped semiconductor and the conductive electrode may, as a result, become Ohmic, due to the relatively high concentration of dopant, having a relatively low-energy barrier to injection of charge carriers into the semiconductor material. Thus, FIG. 3A shows a relatively high-resistance state of the nanoscale electronic device and FIG. 3B shows a relatively low-resistance state of the nanoscale electronic device. The bistable resistance states of the device result in curves similar to those shown in FIG. 2, and the device can be used for storing a bit of information in the same fashion as the device shown in FIGS. 1A-B.

Figure 4:
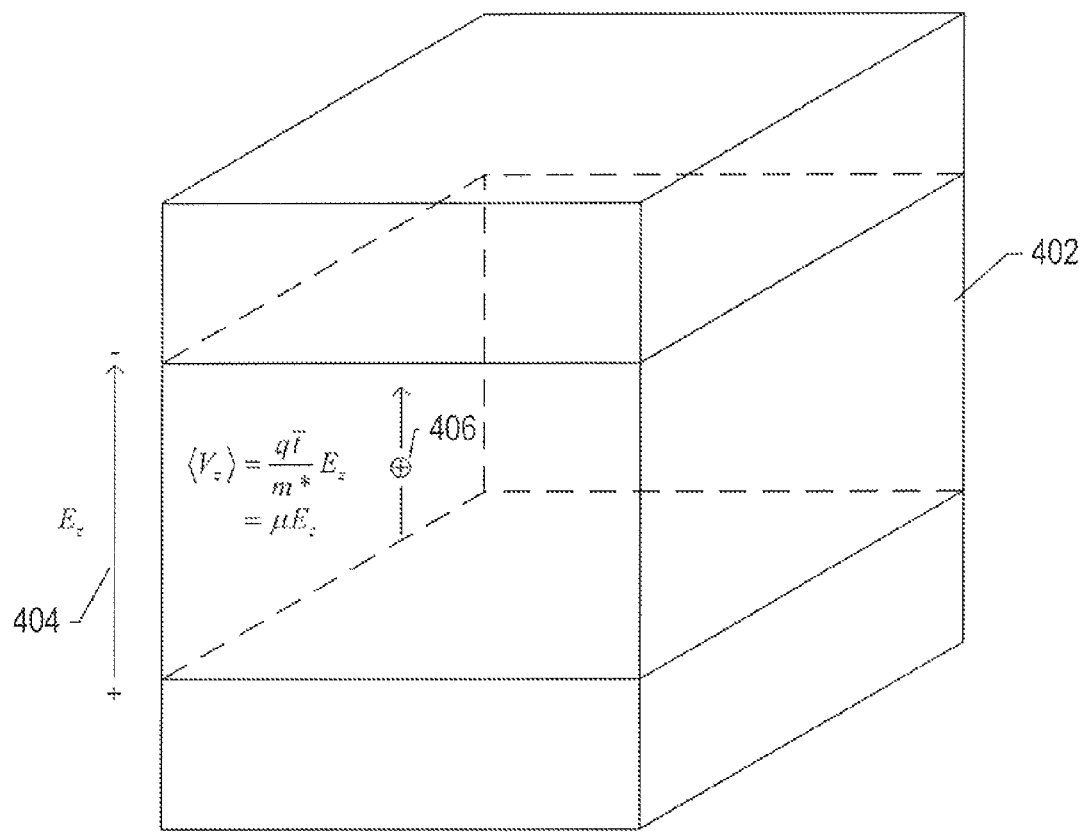
FIG. 4 illustrates ideal movement of the carrier entity, which could be a vacancy, dopant, ion, or other mobile feature of the dielectric material under the influence of an applied electric field.

FIG. 4 illustrates ideal movement of the carrier entity, which could be a vacancy, dopant, ion, or other mobile feature of the dielectric material under the influence of an applied electric field. The carrier entities differ from free carriers, ie., electrons and holes, which carry the overwhelming majority of electrical current through the device. In different types of nanoscale electronic devices, vacancies, dopants, or ions are redistributed, by application of WRITE voltages, to switch the devices. In FIG. 4, which uses the same illustration convention as FIGS. 1A-B and 3A-B, the electric field within the dielectric material 402 in the z direction, where the z direction is the vertical direction from the lower conductive electrode to the upper conductive electrode, normal to the planes of the electrodes, as shown in arrow 404. The average velocity of the carrier entity 406 due to the applied field is proportional to the charge or charge-equivalent property of the carrier entity q, mean time between collisions of the carrier entity with particles or localized forces within the dielectric or semi-conductive material 7, and the magnitude of the field applied in the z direction, $E_z$, and is inversely proportional to the effective mass m* of the carrier entity:

$$\langle V_z \rangle = \frac{q\bar{t}}{m^*} E_z$$

The average velocity of the carrier entity can also be expressed in terms of the mobility $\mu$ of the carrier entity:

$$\langle V_z \rangle = \mu E_z$$

$$\text{where } \mu = \frac{q\bar{t}}{m^*}$$

The average velocity of the carrier entities under the applied field is referred to as the "drift" velocity of the carrier entities. The carrier entities may move, at particular instances in time, in random directions, including in the x and y directions and in directions with components in two or more of the x, y, and z directions, as a result of thermal energy, collisions, defects in the lattice of the dielectric material, collisions with impurities, and for other reasons. However, the mobility of the carrier entity and the magnitude of the field applied across the dielectric material in the z direction results in an average velocity in the z direction, as expressed above, and the carrier-element paths are largely z-direction paths, when viewed at nanoscale dimensions.

Increasing the strength of the applied field increases the velocity of the carrier entities. While the relationship appears linear in the above expressions, the relationship is clearly non-linear for the devices shown in FIGS. 1A-B and 3A-B. In these devices, the mobility of the carrier entities is close to 0 until a threshold applied-field magnitude is reached, after which the velocity increases proportionally to the magnitudes of applied voltages. It is the mobility at high field strength that determines the average velocity of the carrier entities in the z direction during application of WRITE-0 and WRITE-1 voltages, which, in turn, determines the time for switching the device. Increasing the average velocity decreases the switching time. However, as discussed with reference to FIG. 2, the voltage applied across the dielectric material cannot exceed $V_D^-$, when a negative voltage is applied, or $V_D^+$, when a positive voltage is applied. The maximum voltages that can be applied may be further constrained because of power-consumption constraints, constraints due to undesired current paths produced in neighboring circuitry or undesired tunneling between circuit elements, and for other reasons. Thus, the maximum switching frequency of the nanoscale electronic device is directly related to the average velocity that can be imparted to carrier entities within the dielectric material by applied voltages.

Figure 5:
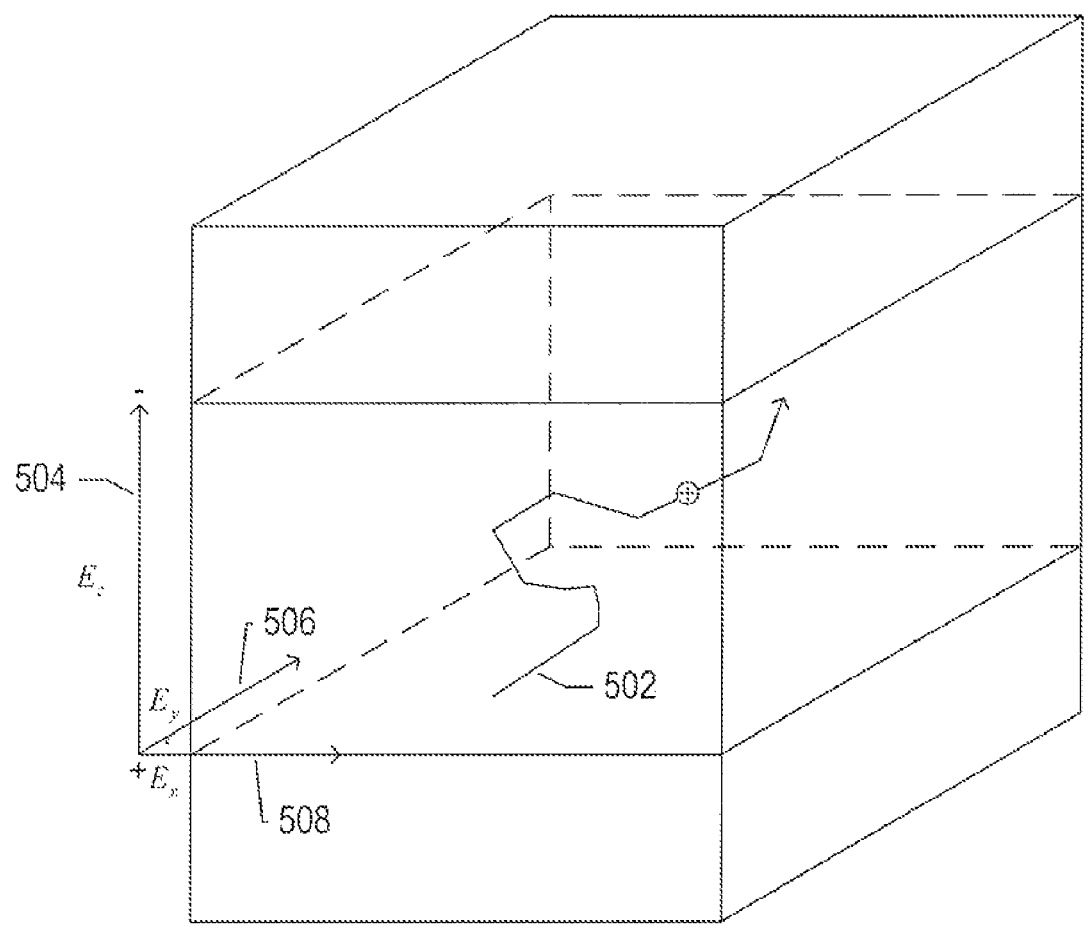
FIG. 5 illustrates a non-ideal path of a carrier entity within a dielectric material of a nanoscale device.

FIG. 5 illustrates a non-ideal path of a carrier entity within a dielectric material of a nanoscale device. An ideal vertical path for the carrier entity, as shown in FIG. 4, is a straight line in the z direction, but, when a carrier entity moves along a non-ideal path, the carrier entity frequently changes direction and travels in directions with non-zero x and y components, resulting in an erratic, relatively long path 502 compared to the ideal path shown in FIG. 4. The non-ideal path may result from many different physical effects and characteristics within the dielectric material under applied voltage. All practical materials exhibit a degree of randomness which leads to scattering in directions with components perpendicular to the applied electric, field. As one example, when the dielectric material is anisotropic, the internal electric field within the dielectric material may have $E_z$ 504, $E_y$ 506, and $E_x$ 508 components, and thus the internal field may not be oriented along the z direction, even though the external field applied to the material by a voltage potential across the electrodes is primarily oriented in the z direction. In addition, collisions of the carrier entities with other particles and lattice defects, and many other characteristics and effects, can lead to the non-ideal path shown in FIG. 502. There are an essentially limitless number of different non-ideal paths of different lengths that may be followed by a carrier entity depending on instantaneous, local, microscopic conditions of the dielectric material within a neighborhood of the carrier entity.

Figure 6A:
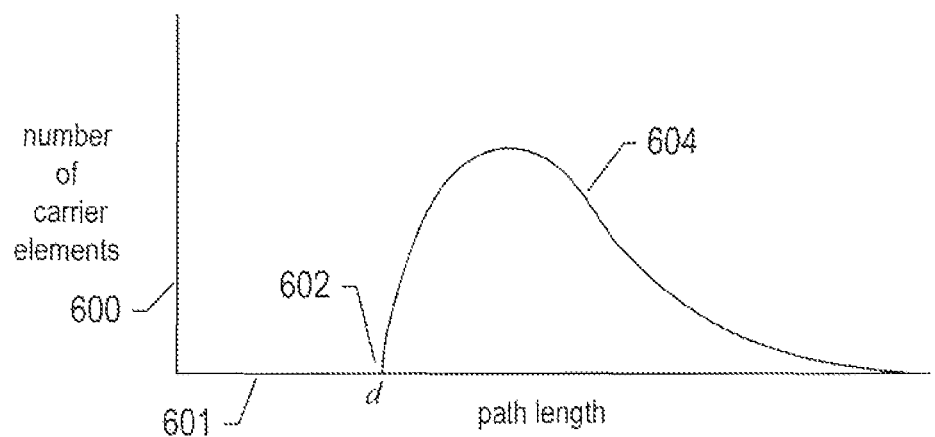
FIGS. 6A-C provide graphs that illustrate non-ideal material characteristics produced by the non-ideal paths of carrier entities discussed with reference to FIG. 5.
Figure 6B:
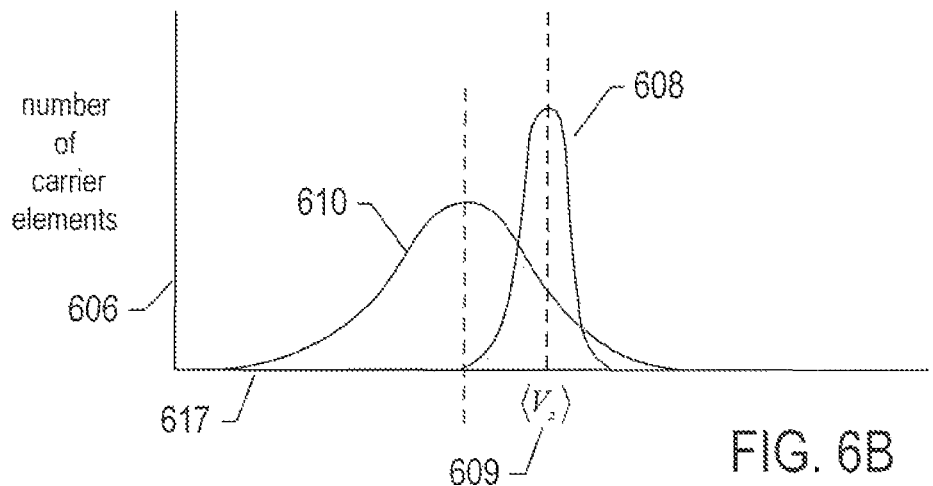
Figure 6C:
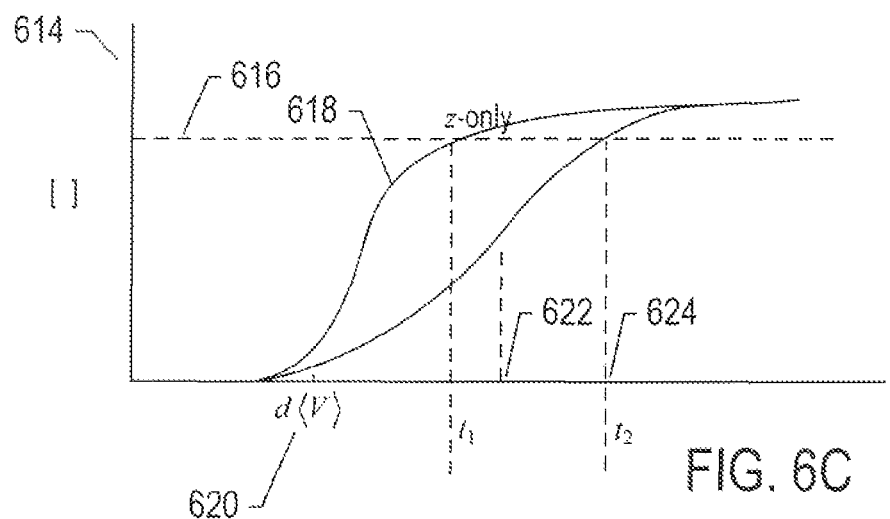

FIGS. 6A-C provide graphs that illustrate non-ideal material characteristics produced by the non-ideal paths of carrier entities discussed with reference to FIG. 5. FIG. 6A shows distribution of path lengths resulting from non-ideal paths followed by carrier entities. In FIG. 6A, the vertical axis 600 represents the number of carrier entities and the horizontal axis 601 represents path lengths. Were all the carrier entities to follow the ideal, vertical path shown in FIG. 4, there would be a single path length for carrier entities d 602 and the distribution would be a vertical line of height proportional to the number of carrier entities within the dielectric material. However, because there are multiple different non-ideal paths which carrier entities take under an external applied field in the z direction, as discussed with reference to FIG. 5, the path lengths are instead distributed over a range of path lengths, as indicated by curve 604. The area under the curve is equal to the total number of carrier entities in the dielectric material. Thus, the average path length is greater than the ideal path length d, and a significant percentage of carrier entities will follow much longer paths than the ideal path with length d.

FIG. 6B illustrates changes in the distribution of velocities of the carrier entities in the z direction as a result of non-ideal paths followed by carrier entities. In FIG. 6B, the vertical axis 606 represents the number of carrier entities and the horizontal axis 607 represents z-direction velocities averaged over a path length. The distribution curve 606 represents distribution of velocities in the ideal case in which carrier entities travel primarily in the z direction, with relatively minor thermal and collision excursions. In this case, the distribution of velocities is relatively narrow about the average velocity $\langle V_z \rangle$ 608. However, in the case carrier entities follow non-ideal paths, the effective field strength imparting velocity to the carrier entity, when the carrier entity is moving in a non-z direction, is less than $E_z$, and therefore the velocity of the particle in the z direction is less than were the carrier entity moving in the z direction. As a result, the distribution of velocities of carrier entities is broadened and the average velocity in the z direction decreases, as represented by the distribution 610 for the non-ideal case illustrated in FIG. 5.

FIG. 6C illustrates the effect on switching time produced by the non-ideal paths of carrier entities in a dielectric material. In FIG. 6C, the vertical axis 614 corresponds to the concentration of carrier entities at a desired point in a dielectric or semi-conductive material to which the carrier entities are moved over a distance d by application of an external electric field $E_z$, with the dashed horizontal line 616 representing a threshold concentration needed for the nanoscale device to be placed into a desired resistance state. When the carrier entities move in ideal paths, as illustrated in FIG. 4, the concentration curve 618 shows an inflection point near the time d⟨V$_z$⟩ 620 and reaches the desired concentration at time t$_1$' By contrast, due to the broad distribution of path lengths shown in FIG. 6A and the broad distribution of velocities shown in FIG. 6B for carrier entities following non-ideal paths, the inflection point 622 for the concentration curve occurs at a time greater than d⟨V$_z$⟩, the concentration curve is shallower, and the desired concentration for switching is reached at time t$_2$ 624, which is substantially greater than time t$_1$ for the ideal-path case. The tendency for carrier entities to move in the dielectric material along non-ideal paths, as shown in FIG. 5, rather than the ideal paths shown in FIG. 4, results in significantly decreased switching times. In order to increase the switching times, a greater field or potential can be applied across the dielectric material, but application of greater fields may result in significantly increase power consumption by an integrated circuit that includes nanoscale electronic devices of this type and undesired tunneling and current paths and decreased reliability of the integrated circuit may ensue.

Figure 7:
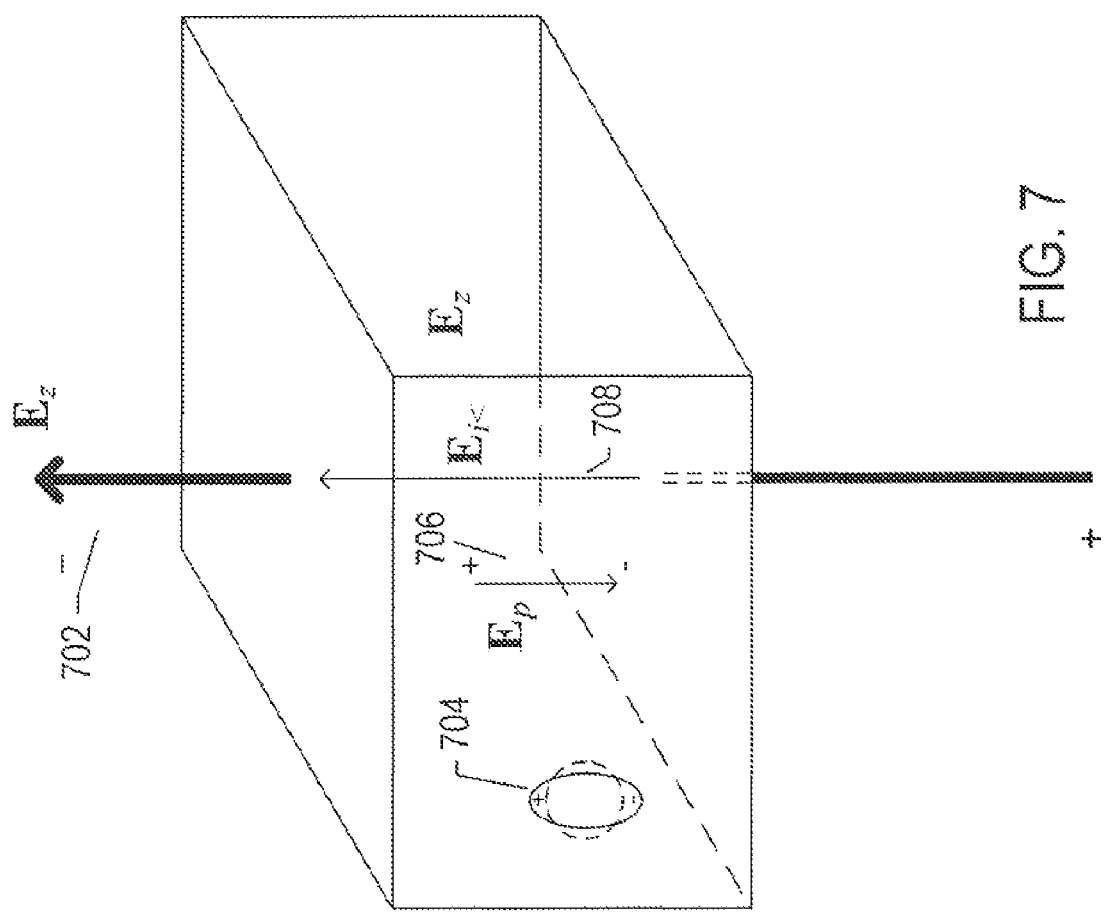
FIG. 7 illustrates polarization of a dielectric material.

FIG. 7 illustrates polarization of a dielectric material. In FIG. 7, an external field E$_z$ 702 is applied across the dielectric material of a nanoscale device. Within the dielectric material, this applied field results in a creation of a dipole moment, or slight charge separation, within atoms and molecules of the dielectric substance, as indicated by the ellipsoid 704 in FIG. 7. This induced dipole produces an internal electric field 706 due to polarization opposite in direction to the externally applied electric field E$_z$ 702. As a result, the effective internal electric field E$_i$ within the dielectric substance 708, obtained by vector addition of the externally applied field and the oppositely-directed field due to polarization, is less than the external field. Thus, applying an external electric field to a polarizable dielectric material results in an internal shielding within the material with respect to the externally applied field. Because the average velocities of carrier entities is proportional to the field experienced by the carrier entities within the dielectric material, polarization and external-field shielding result in lower velocities of carrier entities. Gauss's law, in both differential and integral form, basically states that the flux of an electronic field near a surface enclosing a charge is proportional to the enclosed charge:

$$\nabla \cdot E = \frac{1}{\varepsilon_0}\rho$$

$$\oint E \cdot da = \frac{Q}{\varepsilon_0}$$

where
  ρ is the charge density;
  Q is the enclosed charge; and
  ∈$_0$ is the permittivity of free space
For determining the effects of charge and applied fields within dielectric materials, the electric displacement vector D is used. The electric displacement vector D can be used an alternative version of Gauss's law:

$$\nabla \cdot D = \rho_f$$

$$\oint D \cdot da = Q_f$$

where Q$_f$ is enclosed free charge
In the free-space version of Gauss's law, ρ is the charge density, while in the electric-displacement-vector version of Gauss's law, ρ$_f$ is a density of free charge within a dielectric material. The free charge is the mobile charge that can move within the medium, as opposed to bound charge that is produced by polarization of atoms and molecules. The electric displacement vector D is related to the electric field E by:

$$D = \in_0 E + P$$

where P is the polarizability of the dielectric material. P can be expressed as:

$$P = \in_0 \chi_e E$$

where $\chi_e$ is the electronic susceptibility of the dielectric material

Using this expression, alternative expressions for D can be formulated as follows:

$$D = \in_0 E + P = \in_0 E + \in_0 \chi_e E = \in_e(1+\chi_e)E$$

The permittivity ∈ of the dielectric material can be expressed as follows:

$$\in = \in_0(1+\chi_e)$$

and the electronic displacement vector can then be expressed as:

$$D = \in E$$

The permittivity of the dielectric material can be alternatively expressed in terms of the relative permittivity ∈$_r$ of the dielectric material, or dielectric constant of the dielectric material:

$$\in = \in_0 \in_r$$

For anisotropic materials, the permittivity of the material ∈ is second order tensor that reflects different permittivities in different directions within the material:

$$D = \varepsilon E = \begin{bmatrix} \varepsilon_{xx} & \varepsilon_{xy} & \varepsilon_{xz} \\ \varepsilon_{yx} & \varepsilon_{yy} & \varepsilon_{yz} \\ \varepsilon_{zx} & \varepsilon_{zy} & \varepsilon_{zz} \end{bmatrix} E$$

Note that, just as a vector E can be rotated by application of a rotation operation R without changing the vector's magnitude or relative position with respect to other vectors, when the other vectors are also rotated by a rotation operation R:

$$E' = RE$$

a tensor can also be rotated by a rotation operator:

$$\in' = R \in R^T.$$

Both vectors and tensors can be transformed by rotation operations in order to effect a rotation of the coordinate system within which they are manipulated. The physical meanings of both vectors and tensors are thus coordinate-system invariant.

Figure 8:
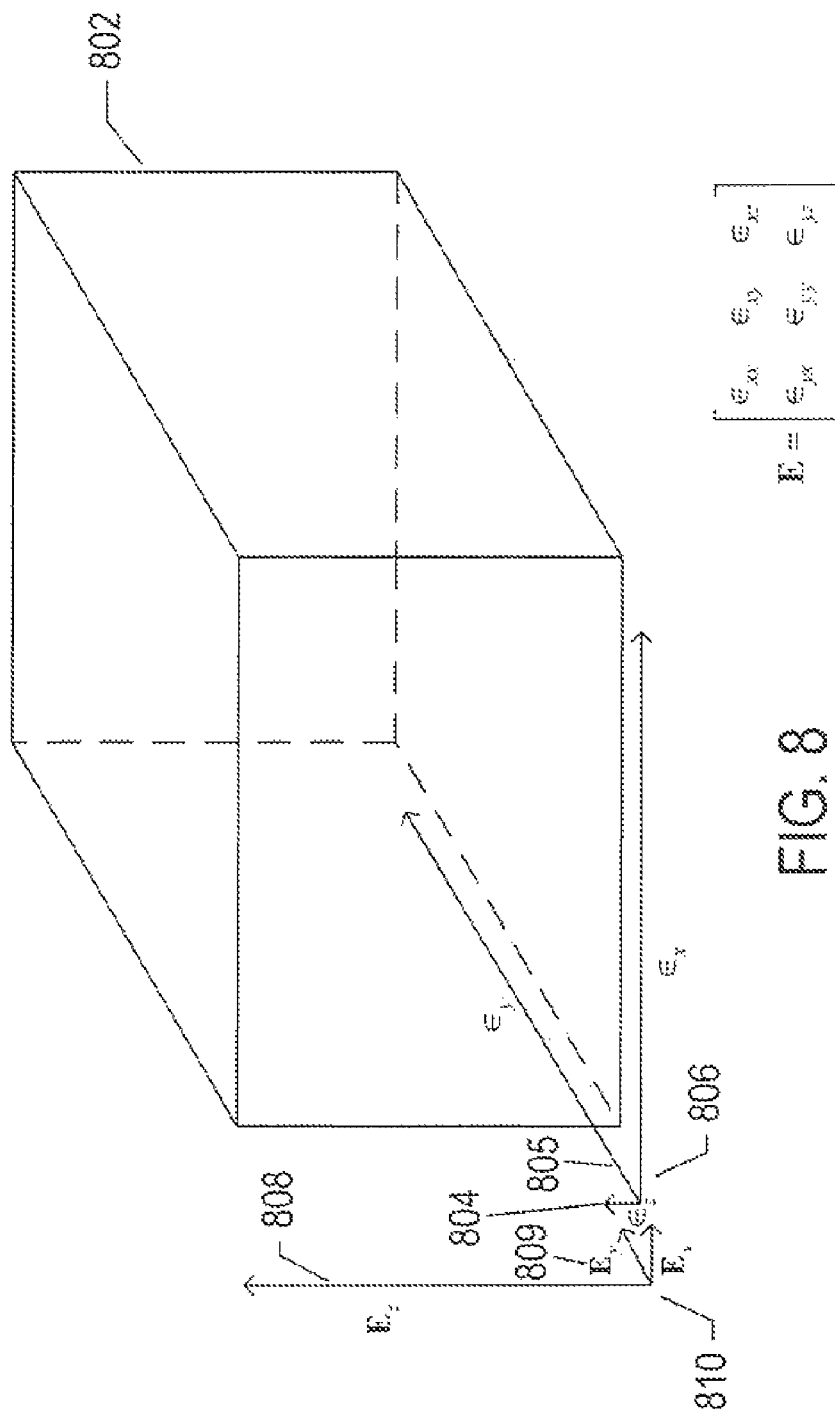
FIG. 8 illustrates one approach to decreasing switching times and decreasing power consumption during operation of nanoscale electronic devices according to the present invention.

FIG. 8 illustrates one approach to decreasing switching times and decreasing power consumption during operation of nanoscale electronic devices according to the present invention. FIG. 8 shows the dielectric or semiconductor layer 802 of a nanoscale electronic device such as those illustrated in FIGS. 1A-B and 3A-B. In this case, an oriented, anisotropic dielectric material is used as the bistable layer of a nanoscale electronic device. For an anisotropic material, the material permittivity tensor ∈ features elements with different magnitudes. In the current case, a desirable dielectric material has a permittivity tensor of the form:

$$\varepsilon = \begin{bmatrix} \varepsilon_{xx} & \varepsilon_{xy} & \varepsilon_{xz} \\ \varepsilon_{yx} & \varepsilon_{yy} & \varepsilon_{yz} \\ \varepsilon_{zx} & \varepsilon_{zy} & \varepsilon_{zz} \end{bmatrix}$$

where $\varepsilon_{ij} \ll \varepsilon_{zz} = \varepsilon_0$.

When the permittivity tensor has this form, or when the permittivity tensor can be placed in this form by a suitable choice of coordinate system, an applied field in the z direction, $E_z$, with vector representation:

$$E_z = \begin{bmatrix} 0 \\ 0 \\ |E| \end{bmatrix}$$

corresponds to an electronic displacement vector:

$$D = \begin{bmatrix} 0 \\ 0 \\ \varepsilon_0 |E| \end{bmatrix}$$

Of course, in any real-world situation, the applied force between conductors may have small components in the x and y directions, but, in this case, the large magnitudes of the non-$\varepsilon_{zz}$ elements of the permittivity tensor ensure that the electronic displacement vector will have the form:

$$D = \begin{bmatrix} |D_x| \ll |D_z| \\ |D_y| \ll |D_z| \\ |D_z| > \varepsilon_0 |E| \end{bmatrix}$$

Of course, the $\varepsilon_{zz}$ element of the permittivity tensor for useful dielectric materials is greater than $\varepsilon_0$, but the closer that $\varepsilon_{zz}$ approaches $\varepsilon_0$, the better, and the greater the disparity in magnitude between $\varepsilon_{zz}$ and all other elements of the permittivity tensor $\varepsilon$, the better. As discussed above, the displacement vector D represents, in a way, the effective electric-field flux through the dielectric material as determined by migration of free carriers within the dielectric material due to an applied external field E. However, because of field shielding due to polarization of the dielectric material, the internal, local field strength within the dielectric material has lower magnitude than the external field, and is related to D by the proportionality constant $\varepsilon$. The greater $\varepsilon$, the smaller the local internal field. Thus, as shown in FIG. 8, when displacement vector has the form:

$$D = \begin{bmatrix} |D_x| \ll |D_z| \\ |D_y| \ll |D_z| \\ |D_z| > \varepsilon_0 |E| \end{bmatrix}$$

and the corresponding permittivity components of the dielectric-field permittivity have magnitudes represented in FIG. 8 by the three mutually perpendicular permittivity components $\varepsilon_x$, $\varepsilon_y$, and $\varepsilon_z$ 804-806, the components of the internal field within the dielectric have inversely related magnitudes, as indicated in FIG. 8 by the three mutually perpendicular E components $E_z$ 808, $E_y$ 809, and $E_x$ 810. Therefore, carrier entities within the dielectric material will be far more likely to follow ideal or near ideal paths; as illustrated in FIG. 4, rather than non-ideal paths, as illustrated in FIG. 5, leading to narrower distributions of path lengths, narrower distributions of velocities of carrier entities, and a higher average velocity of carrier entities in the z direction, $\langle V_z \rangle$.

As discussed above, the polarization tensor, like a vector, is invariant under coordinate-axes rotations. Thus, although the z direction is chosen to illustrate the desired anisotropic properties of dielectric materials for use in examples of the present invention, desirable dielectric materials used in nanoscale electronic devices according to the present invention have one, internal direction in which the permittivity is substantially lower than in other directions within the material, and as close to $\varepsilon_0$ as possible. By a suitable selection of a coordinate system, such materials can be described by a permittivity tensor $\varepsilon$ with element $\varepsilon_{zz}$ lower, in magnitude, than other elements of the tensor $\varepsilon_{ij}$. In fabricating a nanoscale electronic device according to the present invention, the material is oriented within the device so that the direction of lowest permittivity is orthogonal to the planes of the upper and lower electrodes, as shown in FIG. 8.

There are many different types of dielectric materials with properties corresponding to the permittivity tensor discussed with reference to FIG. 8. Examples include materials with superlattices of one atomic or molecular component interleaved with lattices of another atomic or molecular component or components having different dielectric constants. Many pure crystalline or structured dielectric materials have a desirable anisotropic permittivity tensor discussed with reference to FIG. 8, including graphene, intercalated compounds, perovskites, $TiO_x$, where x ranges from 0.68 to 0.75, $TaO_x$, an oxide in the crystalline form of rutile, $MO_2$ or $M_2O_3$, where M is a metallic element, strained $SrTiO3$ and related crystalline materials that are centrosymmetric but exhibit an anisotropic response to applied electrical fields, and other such materials. It should be noted that the dielectric constant of a material may vary, in magnitude, depending on the strength of the applied electric field. In general, for applications to nanoscale electronic devices such as those shown in FIGS. 1A-B and 3A-B, the mobilities and velocities of the significant carrier entities are of relatively small magnitudes, and it is therefore the low-field-strength permittivity tensor that is of greatest significance.

Figure 9:
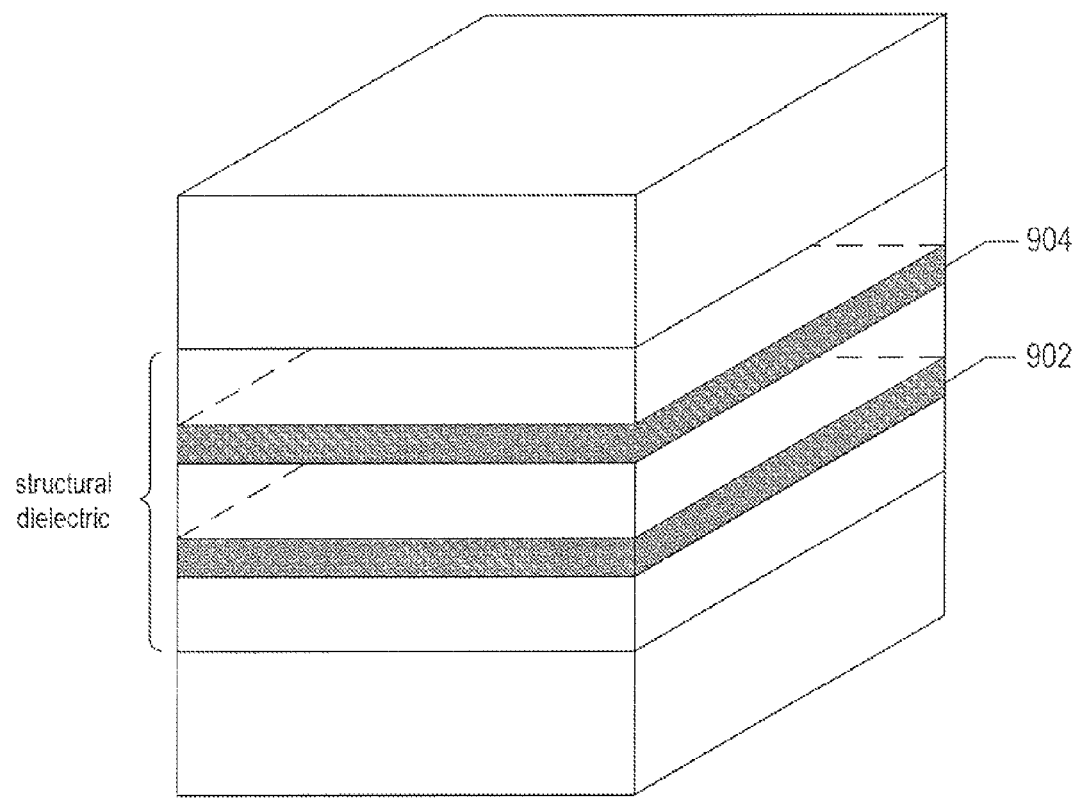
FIG. 9 illustrates a first nanoscale structured material with desired anisotropic properties discussed with reference to FIG. 8 that can be used, according to the present invention, in nanoscale electronic devices.

In addition to selecting materials with desired anisotropic properties, materials can be structured at the nanoscale to have the desired anisotropic characteristics discussed above with reference to FIG. 8. FIG. 9 illustrates a first nanoscale structured material with desired anisotropic properties discussed with reference to FIG. 8 that can be used, according to the present invention, in nanoscale electronic devices. In this material, as shown in FIG. 9, one, two or more parallel conductive layers 902 and 904 are fabricated within the bulk dielectric material. The conductive layers may be formed, as one example, by introducing immobile dopants or ions within these layers. By adding conductive layers, the probability for non-ideal paths with large excursions in directions other than the z direction is decreased, since the distance in the z direction for which carrier entities need to be moved between charged surfaces is divided into two or more shorter distances. Moreover, the parallel conductive layers tend to concentrate the internal field in the z direction.

Figure 10:
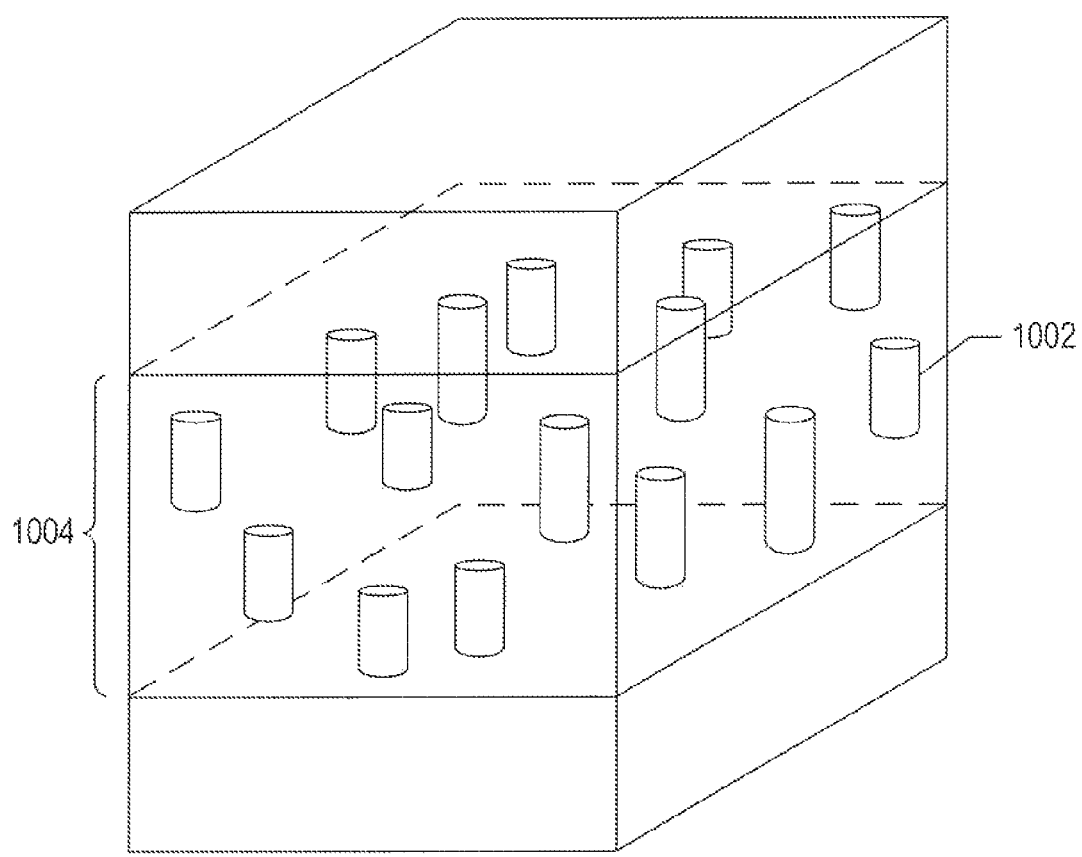
FIG. 10 illustrates a second nanoscale structured material with desired anisotropic properties discussed with reference to FIG. 8 that can be used, according to the present invention, in nanoscale electronic devices.

FIG. 10 illustrates a second nanoscale structured material with desired anisotropic properties discussed with reference to FIG. 8 that can be used, according to the present invention, in nanoscale electronic devices. Oriented, conductive nanowires, such as nanowire 1002, are interspersed within this dielectric material 1004. The conductive nanowires act to channel the applied electric-field flux in the z direction within the dielectric material and also to shorten possible non-ideal paths with x- and y-direction components. The conductive nanowires are significantly shorter than the distance between the electrodes, to avoid shorting the nanoscale electronic device. The conductive nanowires may be regularly positioned within the dielectric material or, in alternative examples, may be randomly positioned. While orientation of the long axis of the nanowires in the z direction may provide greatest benefit, departures from this orientation may nonetheless produce desirable anisotropic properties for the structured dielectric material. In addition to nanowires, conductive nanoparticles with roughly spherical or with irregular shapes and/or nanotubes or nanocylinders may also be introduced into the dielectric material to achieve strengthening of the electric-field flux in the z direction and shortening of non-ideal path lengths.

Figure 11:
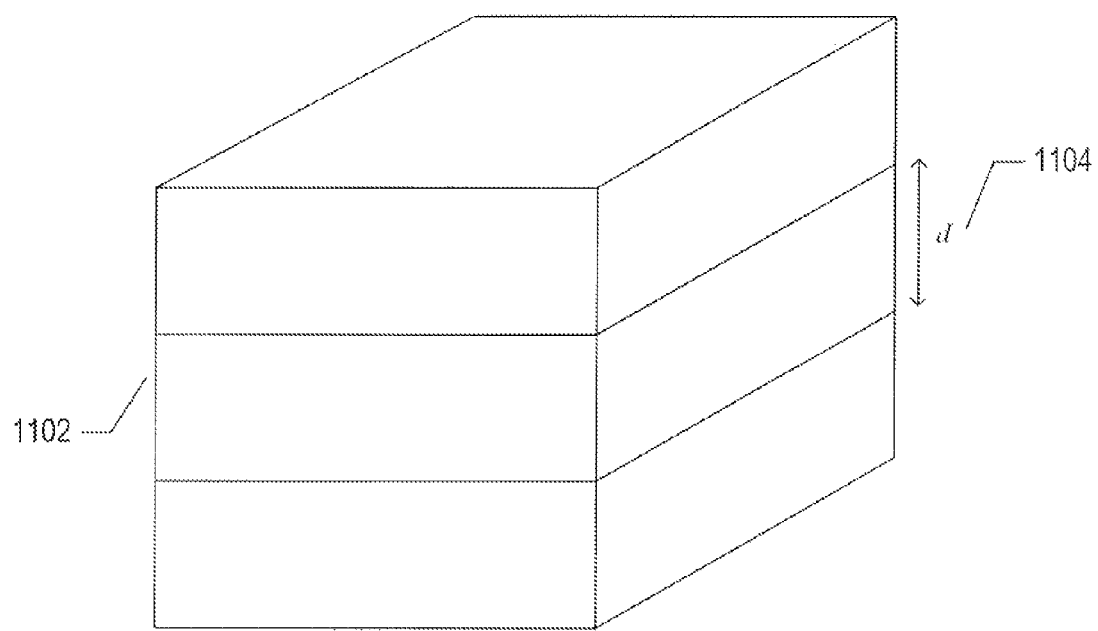
FIG. 11 illustrates yet an additional example of a nanoscale electronic device constructed according to the present invention.

FIG. 11 illustrates yet an additional example of a nanoscale electronic device constructed according to the present invention. A dielectric material with a significantly greater band gap can be used as the dielectric layer 1102 within a nanoscale electronic device so that the distance d 1104 between the parallel electrodes can be shortened. Shortening the distance between electrodes significantly decreases the probability that carrier entities will follow long, non-ideal paths under an applied external electric field.

Although the present invention has been described in terms of particular embodiments, it is not intended that the invention be limited to these embodiments. Modifications will be apparent to those skilled in the art. For example, many of a large variety of bistable dielectric materials or materials with three or more stable electronic states can be used in nanoscale electronic devices according to the present invention when the materials have a direction of significantly lower permittivity that can be oriented along the z direction in a nanoscale electronic device. As discussed with reference to FIGS. 9-11, any of a variety of different types of structured dielectric material can be employed to impart the desired anisotropy in the dielectric or semiconductor layer of nanoscale electronic devices. As one example of the present invention, certain dielectric materials with the desired anisotropic characteristics can be grown, by epitaxial-deposition techniques, with the proper z-axis orientation discussed above with reference to FIG. 8. Additional types of nanoscale electronic devices featuring multiple dielectric and/or semiconductor layers can also be fabricated, according to the present invention, by selecting suitable dielectric and semiconductor materials, or by nanoscale fabrication of dielectric and semiconductor materials, with the desired anisotropy and desired orientation, as discussed above with reference to FIG. 8. In general, many nanoscale electronic devices with oriented, anisotropic dielectric materials according to the present invention are incorporated together within integrated circuits. The integrated circuits generally contain conventional sub-microscale components and interconnections in addition to multiple nanoscale electronic-device components interconnected by nanoscale interconnects.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale electronic device comprising:
a first conductive electrode;
a second conductive electrode; and
an anisotropic dielectric material layered between the first and second electrodes having a permittivity in a direction approximately that of the shortest distance between the first and second electrodes less than the permittivity in other directions within the anisotropic dielectric material.

2. The nanoscale electronic device of claim 1 wherein the anisotropic dielectric material is a crystalline dielectric material.

3. The nanoscale electronic device of claim 2 wherein the anisotropic dielectric material is one of:
a perovskite;
$TiO_x$, where x ranges from 0.68 to 0.75;
$TaO_x$;
an oxide in the crystalline form of rutile, $MO_2$ or $M_2O_3$, where M is a metallic element; and
strained SrTiO3 and related crystalline materials that are centrosymmetric but exhibit an anisotropic response to applied electrical fields.

4. The nanoscale electronic device of claim 1 wherein the anisotropic dielectric material is a semicrystalline dielectric material.

5. The nanoscale electronic device of claim 1 wherein the anisotropic dielectric material is a quasicrystalline dielectric material.

6. The nanoscale electronic device of claim 1 wherein the anisotropic dielectric material is a structured material in which one or more conductive planes parallel to the first and second electrodes are fabricated.

7. The nanoscale electronic device of claim 1 wherein the anisotropic dielectric material is a structured material that includes nanowires oriented in the direction of lowest permittivity.

8. The nanoscale electronic device of claim 1 wherein the anisotropic dielectric material is a structured material that includes nanotubes oriented in the direction of lowest permittivity.

9. The nanoscale electronic device of claim 1 wherein the anisotropic dielectric material is a structured material that includes one or more layers regularly patterned at nanoscale dimensions.

10. The nanoscale electronic device of claim 1 wherein the anisotropic dielectric material is a structured material that includes conductive or highly polarizable, anisotropic nanoparticles.

11. An integrated circuit that includes a plurality of nanoscale electronic devices, each nanoscale electronic device including an anisotropic dielectric material layered between a first and second electrode having a permittivity in a direction approximately that of the shortest distance between the first and second electrodes less than the permittivity in other directions within the anisotropic dielectric material.

12. The integrated circuit of claim 11 wherein the anisotropic dielectric material of one or more of the nanoscale electronic devices is a crystalline dielectric material, semicrystalline dielectric material, or quasicrystalline dielectric material.

13. The integrated circuit of claim 11 wherein the anisotropic dielectric material is one of:
   a perovskite;
   $TiO_x$, where x ranges from 0.68 to 0.75;
   $TaO_x$;
   graphene;
   an oxide in the crystalline form of rutile, $MO_2$ or $M_2O_3$, where M is a metallic element; and
   strained SrTiO3 and related crystalline materials that are centrosymmetric but exhibit an anisotropic response to applied electrical fields.

14. The integrated circuit of claim 11 wherein the anisotropic dielectric material of one or more of the nanoscale electronic devices is a structured material in which one or more conductive planes parallel to the first and second electrodes are fabricated.

15. The integrated circuit of claim wherein the anisotropic dielectric material of one or more of the nanoscale electronic devices is a structured material with inclusions, the inclusions one of:
   nanowires oriented in the direction of lowest permittivity;
   conductive or highly polarizable, anisotropic nanoparticles;
   nanotubes oriented in the direction of lowest permittivity.

16. The integrated circuit of claim 11 wherein the anisotropic dielectric material is a structured material that includes one or more layers regularly patterned at nanoscale dimensions.

17. A method for fabricating a nanoscale electronic device, the method comprising:
   fabricating a first electrode;
   fabricating, adjacent to the first electrode, a layer of an anisotropic dielectric material; and
   fabricating a second electrode;
   wherein the anisotropic dielectric material has a permittivity in a direction approximately that of the shortest distance between the first and second electrodes less than the permittivity in other directions within the anisotropic dielectric material.

18. The method of claim 17 wherein the anisotropic dielectric material is a crystalline material fabricated by epitaxial deposition.

19. The method of claim 17 wherein the anisotropic dielectric material is a structured dielectric material selected from among:
   a dielectric material with one or more layers regularly patterned at nanoscale dimensions;
   a structured material in which one or more conductive planes parallel to the first and second electrodes are fabricated;
   a structured material that includes nanowires oriented in the direction of lowest permittivity; and
   a structured material that includes nanotubes oriented in the direction of lowest permittivity; and
   a structured material that includes conductive or highly polarizable, anisotropic nanoparticles.

20. The method of claim 19 further including fabricating, within an integrated circuit, a plurality of nanoscale electronic devices with oriented layers of anisotropic dielectric materials having permittivities in one direction less than the permittivities in any other direction within the anisotropic dielectric material.

* * * * *

UNITED STATES PATENT AND TRADEMARK OFFICE
CERTIFICATE OF CORRECTION

PATENT NO. : 8,314,475 B2  
APPLICATION NO. : 12/942131  
DATED : November 20, 2012  
INVENTOR(S) : Gilberto Medeiros Ribeiro et al.

It is certified that error appears in the above-identified patent and that said Letters Patent is hereby corrected as shown below:

In the Claims

In column 13, line 21, in Claim 15, delete "claim" and insert -- claim 11 --, therefor.

Signed and Sealed this  
Fourteenth Day of May, 2013

Teresa Stanek Rea  
*Acting Director of the United States Patent and Trademark Office*